United States Patent
Zhang (10) Patent No.: US 12,200,951 B2
(45) Date of Patent: Jan. 14, 2025

(54) DISPLAY PANEL HAVING RED LIGHT-EMITTING LAYER WITH DIFFERENT DOPING CONCENTRATIONS RESPECTIVELY AT CENTER POINT OF THE DISPLAY PANEL AND OTHER AREA THEREOF, FABRICATION THEREOF AND DISPLAY DEVICE

(71) Applicants: WUHAN CHINA STAR OPTOELECTRONICS TECHNOLOGY CO., LTD., Wuhan (CN); WUHAN CHINA STAR OPTOELECTRONICS SEMICONDUCTOR DISPLAY TECHNOLOGY CO., LTD., Wuhan (CN)

(72) Inventor: Tingting Zhang, Wuhan (CN)

(73) Assignees: WUHAN CHINA STAR OPTOELECTRONICS TECHNOLOGY CO., LTD., Wuhan (CN); WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 540 days.

(21) Appl. No.: 17/598,860

(22) PCT Filed: May 31, 2021

(86) PCT No.: PCT/CN2021/097475
§ 371 (c)(1),
(2) Date: Sep. 27, 2021

(87) PCT Pub. No.: WO2022/246876
PCT Pub. Date: Dec. 1, 2022

(65) Prior Publication Data
US 2023/0240090 A1 Jul. 27, 2023

(30) Foreign Application Priority Data

May 25, 2021 (CN) .......................... 202110570599.2

(51) Int. Cl.
H10K 50/12 (2023.01)
H10K 59/12 (2023.01)
H10K 59/35 (2023.01)

(52) U.S. Cl.
CPC ......... H10K 50/12 (2023.02); H10K 59/1201 (2023.02); *H10K 59/35* (2023.02)

(58) Field of Classification Search
CPC ..... H10K 50/12; H10K 59/1201; H10K 59/35
(Continued)

(56) References Cited

U.S. PATENT DOCUMENTS

2013/0277662 A1   10/2013  Aratani et al.
2021/0257419 A1*   8/2021  Jang ...................... H10K 59/65

FOREIGN PATENT DOCUMENTS

CN         1582073 A     2/2005
CN       102738410 A    10/2012
(Continued)

OTHER PUBLICATIONS

Chinese Office Action issued in corresponding Chinese Patent Application No. 202110570599.2 dated Jun. 1, 2022, pp. 1-7.
(Continued)

*Primary Examiner* — Hoai V Pham
(74) *Attorney, Agent, or Firm* — PV IP PC; Wei Te Chung (57) ABSTRACT

The present application provides a display panel, a fabrication method thereof, and a display device. The display device includes a light-emitting layer disposed on a driver substrate. A doping concentration of a red light-emitting layer of the light-emitting layer gradually increases or
(Continued)

decreases from a center point of the display panel to the area outside the center point, so that a luminous efficiency of a red light-emitting layer at a center point of the display panel is consistent with a luminous efficiency of the red light-emitting layer in an area outside the center point of the display panel, which solves the problem of color shifting around the display panel.

18 Claims, 6 Drawing Sheets

(58) Field of Classification Search
USPC .................................................... 257/40, 89
See application file for complete search history.

(56) References Cited

FOREIGN PATENT DOCUMENTS

| CN | 104241331 A | 12/2014 |
|----|-------------|---------|
| CN | 110379934 A | 10/2019 |
| CN | 110634444 A | 12/2019 |
| JP | 2011061016 A | 3/2011 |

OTHER PUBLICATIONS

International Search Report in International application No. PCT/CN2021/097475, mailed on Jan. 27, 2022.
Written Opinion of the International Searching Authority in International application No. PCT/CN2021/097475, mailed on Jan. 27, 2022.

* cited by examiner

DISPLAY PANEL HAVING RED LIGHT-EMITTING LAYER WITH DIFFERENT DOPING CONCENTRATIONS RESPECTIVELY AT CENTER POINT OF THE DISPLAY PANEL AND OTHER AREA THEREOF, FABRICATION THEREOF AND DISPLAY DEVICE

RELATED APPLICATIONS

This application is a Notional Phase of PCT Patent Application No. PCT/CN2021/097475 having international filing date of May 31, 2021, which claims the benefit of priority of Chinese Patent Application No. 202110570599.2 filed on May 25, 2021. The contents of the above applications are all incorporated by reference as if fully set forth herein in their entirety.

FIELD OF INVENTION

This application relates to a display technology field, and particularly to a display panel, a fabrication method thereof, and a display device.

BACKGROUND

Compared with a liquid crystal display (LCD), an organic light-emitting display (OLED) has advantages of high color gamut, high contract, flexibility and wearability, etc., which will often become development trends of display industry. With advancement of science and technology, OLED display technology is relatively mature, but there are still some defects that need to be improved. For example, human eyes can observe characteristics of blue and red around a screen, that is, the screen exhibits a color shifting problem.

At present, an OLED screen mostly adopts RGB three-color structure to achieve color display and an encapsulation layer composed of organic materials and inorganic material layers is fabricated on light-emitting structure of the OLED screen to protect the light-emitting structure of the OLED screen from a water and oxygen. However, there will be a thickness difference between an edge and a center of the OLED screen due to variations of fabrication of the encapsulation film layer which leads to the problem of color shifting on the OLED screen.

Therefore, the technical problem of color shifting existing in the existing OLED screen needs to be solved.

SUMMARY OF DISCLOSURE

The present application provides a display panel, a fabrication method thereof, and a display device so as to alleviate the technical problem of color shifting existing of the existing OLED screen.

For solving above problems, technical solutions provided by the present application are as follows:

An embodiment of the present application provides a display panel, comprising:
a driver substrate; and
a light-emitting layer disposed on the driver substrate, wherein the light-emitting layer comprises a red light-emitting layer, and a doping concentration of the red light-emitting layer at a center point of the display panel is different from a doping concentration of the red light-emitting layer in an area other than the center point of the display panel so as to make a luminous efficiency of the red light-emitting layer at the center point of the display panel coincides with a luminous efficiency of the red light-emitting layer in the area other than the center point of the display panel.

In the display panel provided by the embodiment of the present application, the doping concentration of the red light-emitting layer ranges from 0.5% to 4%.

In the display panel provided by the embodiment of the present application the doping concentration of the red light-emitting layer gradually increases from the center point of the display panel to the area other than the center point.

In the display panel provided by the embodiment of the present application, the doping concentration of the red light-emitting layer gradually decreases from the center point of the display panel to the area other than the center point.

In the display panel provided by the embodiment of the present application, the display panel is divided into a plurality of sections from the center point to the area outside the center point, and a doping concentration of the red light-emitting layer in each of the plurality of sections is different.

In the display panel provided by the embodiment of the present application, the doping concentration of the red light-emitting layer in each of the plurality of sections is the same.

In the display panel provided by the embodiment of the present application, the display panel further comprises a light-emitting function layer arranged on the driving substrate and an encapsulation layer arranged on the light-emitting function layer, the light-emitting function layer comprises the light-emitting layer, and the encapsulation layer comprises a first inorganic encapsulation layer, an organic encapsulation layer, and a second inorganic encapsulation layer.

In the display panel provided by the embodiment of the present application, a difference in film thickness of the encapsulation layer ranges from −10% to 10%.

An embodiment of the present application further provides a fabrication method of a display panel, comprising:
providing a driver substrate;
forming a light-emitting layer on the driver substrate, wherein the light-emitting layer comprises a red light-emitting layer, and a doping concentration of the red light-emitting layer at a center point of the display panel is different from a doping concentration of the red light-emitting layer in an area other than the center point of the display panel so as to make a luminous efficiency of the red light-emitting layer at the center point of the display panel coincides with a luminous efficiency of the red light-emitting layer in the area other than the center point of the display panel; and
forming an encapsulation layer on the light-emitting layer.

In fabrication method of the display panel provided by the embodiment of the present application, the doping concentration of the red light-emitting layer ranges from 0.5% to 4%.

In fabrication method of the display panel provided by the embodiment of the present application, the doping concentration of the red light-emitting layer gradually increases from the center point of the display panel to the area other than the center point.

In fabrication method of the display panel provided by the embodiment of the present application, the doping concentration of the red light-emitting layer gradually decreases from the center point of the display panel to the area other than the center point.

In fabrication method of the display panel provided by the embodiment of the present application, the display panel is divided into a plurality of sections from the center point to the area outside the center point, and a doping concentration of the red light-emitting layer in each of the plurality of sections is different.

In fabrication method of the display panel provided by the embodiment of the present application, the doping concentration of the red light-emitting layer in each of the plurality of sections is the same.

An embodiment of the present application further provides a display device which comprises the display panel disclosed in one of the previous embodiments.

A doping concentration of the red light-emitting layer in the display panel, the fabrication method thereof, and the display device provided by the present application gradually increases or decreases from a center point of the display panel to the area outside the center point, so that a luminous efficiency of a red light-emitting layer at a center point of the display panel is consistent with a luminous efficiency of the red light-emitting layer in an area outside the center point of the display panel, which solves the problem of color shifting around the display panel caused by the difference in film thickness of an encapsulation layer, and improves a chromaticity uniformity of the display panel.

BRIEF DESCRIPTION OF DRAWINGS

In order to more clearly illustrate technical solutions in embodiments of the present disclosure, a brief description of accompanying drawings used in a description of the embodiments will be given below. Obviously, the accompanying drawings in the following description are merely some embodiments of the present disclosure. For those skilled in the art, other drawings may be obtained from these accompanying drawings without creative labor.

DETAILED DESCRIPTION

The description of the following embodiments refers to the attached drawings to illustrate specific embodiments that can be implemented in the present application. The directional terms mentioned in this application, such as up, down, front, rear, left, right, inner, outer, side, etc., are only for reference a direction of the additional schema. Therefore, the directional terms used are used to illustrate and understand the application, rather than to limit the application. In the figure, units with similar structures are indicated by the same reference numerals. In the drawings, for clear understanding and ease of description, the thickness of some layers and areas are exaggerated. That is, the size and thickness of each component shown in the drawings are arbitrarily shown, but the application is not limited thereto.

In view of the problem of color shifting around the existing OLED screen, the inventors of the present application found in research that the color shifting problem around the OLED screen is caused by a difference in a film thickness of an encapsulation layer. Generally, the encapsulation layer of the OLED screen can be formed by overlapping a first inorganic encapsulation layer, an organic encapsulation layer and a second inorganic encapsulation layer, which is used to protect a light-emitting layer of the OLED screen and prevent the light-emitting layer from water and oxygen. Of course, the encapsulation layer is also can be formed by overlapping more layers. According to the inventors' research, a variation of a film thickness of the first inorganic encapsulation layer in the encapsulation layer has the greatest influence on the color shifting.

Figure 1:
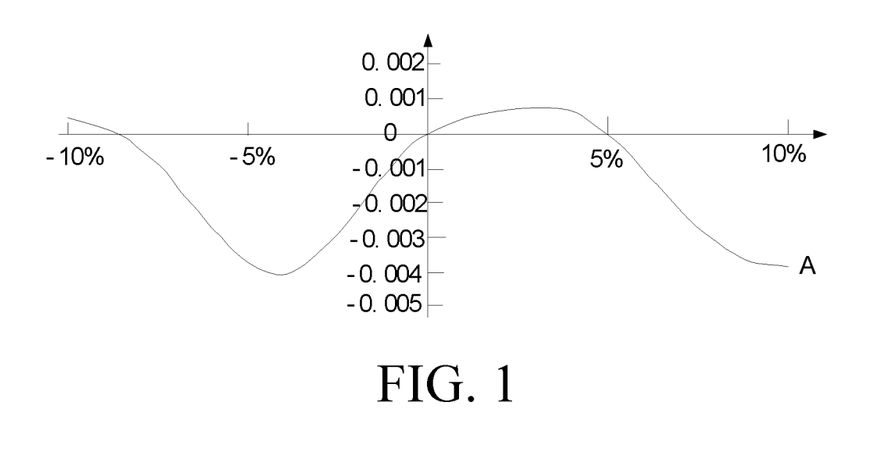
FIG. 1 is a diagram showing a variation trend of a chromaticity difference of an OLED screen in the prior art with differences in a film thickness of a first inorganic encapsulation layer.

Specifically, a white light chromaticity coordinates of a center point of an OLED screen are defined as (u0, v0), a white light chromaticity coordinates of an area outside the center point is defined as (u1, v1), and a chromaticity difference between the center point and the area outside the center point is defined as $\Delta u = u1-u0$ and $\Delta v = v1-v0$. The center point mentioned in the present application refers to a point or an area located in the middle of the OLED screen. Taking the chromaticity difference $\Delta u$ as an example, a variation trend of the chromaticity difference $\Delta u$ with the difference in a film thickness of the first inorganic encapsulation layer is shown in FIG. 1. In FIG. 1, the abscissa represents a difference in a film thickness of the first inorganic encapsulation layer. The film thickness difference range is taken −10% to 10% as an example. An ordinate represents a value of the chromaticity difference $\Delta u$, and a curve A shows the change trend of the chromaticity difference $\Delta u$ with the film thickness difference of the first inorganic encapsulation layer, which can be clearly seen from FIG. 1. The variation range of the chromaticity difference $\Delta u$ is −0.004 to 0.001. When $\Delta u$ is less than 0, the area outside the center point of the OLED screen will appear blue compared to the center point. When $\Delta u$ is greater than 0, the area outside the center point will appear red compared to the center point.

Figure 2:
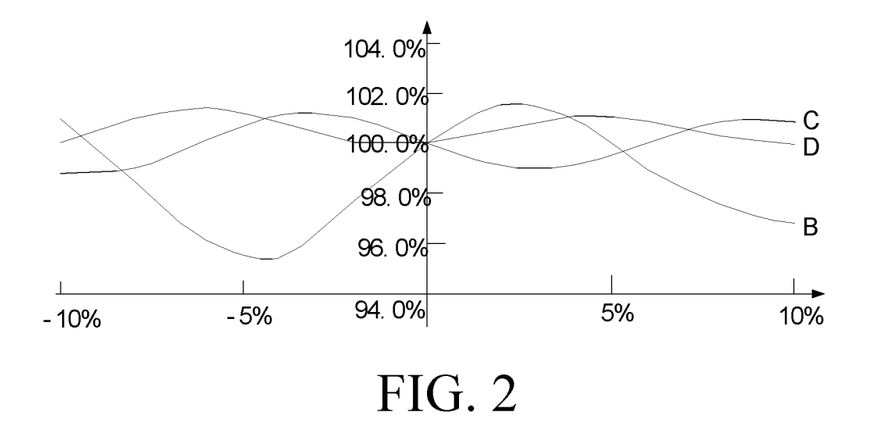
FIG. 2 is a diagram showing a variation trend of a luminous efficiency of a light-emitting layer of an OLED screen in the prior art with differences in a film thickness of a first inorganic encapsulation layer.

Furthermore, the light-emitting layer of the OLED screen may comprise a red light-emitting layer, a green light-emitting layer, and a blue light-emitting layer. The red light-emitting layer, the green light-emitting layer, and the blue light-emitting layer provide three primary colors of red, green and blue for the OLED screen to achieve color display. A variation trend of a luminous efficiency of the red light-emitting layer, the green light-emitting layer and the blue light-emitting layer with the difference of the film thickness of the first inorganic encapsulation layer is shown in FIG. 2. In FIG. 2, the abscissa represents a film thickness of the first inorganic encapsulation layer, and the film thickness difference range is taken −10% to 10% as an example, and the ordinate represents a value of luminous efficiency. A curve B represents the change trend of a luminous efficiency of the red light-emitting layer with the difference of the film thickness of the first inorganic encapsulation layer, a curve C represents a variation trend of a luminous efficiency of the green light-emitting layer with the difference in a film thickness of the first inorganic encapsulation layer, and a curve D represents a variation trend of a luminous efficiency of the blue light-emitting layer with the difference in a film thickness of the first inorganic encapsulation layer.

Referring to FIG. 1 and FIG. 2 in combination, it can be clearly seen that a law of the chromaticity difference Δu with the film thickness of the first inorganic encapsulation layer is consistent with a law of the luminous efficiency of the red light-emitting layer with the film thickness of the first inorganic encapsulation layer. When the area outside the center point of the OLED screen appears blue, the red light efficiency outside the center point is less than the center point; when the area outside the center point of the OLED screen appears red, the red light efficiency outside the center point is greater than the center point. Based on this, the luminous efficiency of the red light-emitting layer can be adjusted to improve the color shifting problem in areas other than the center point.

Therefore, the inventors of the present application propose a display panel and a fabrication method thereof based on the above research to solve the problem of color shifting.

Figure 3:
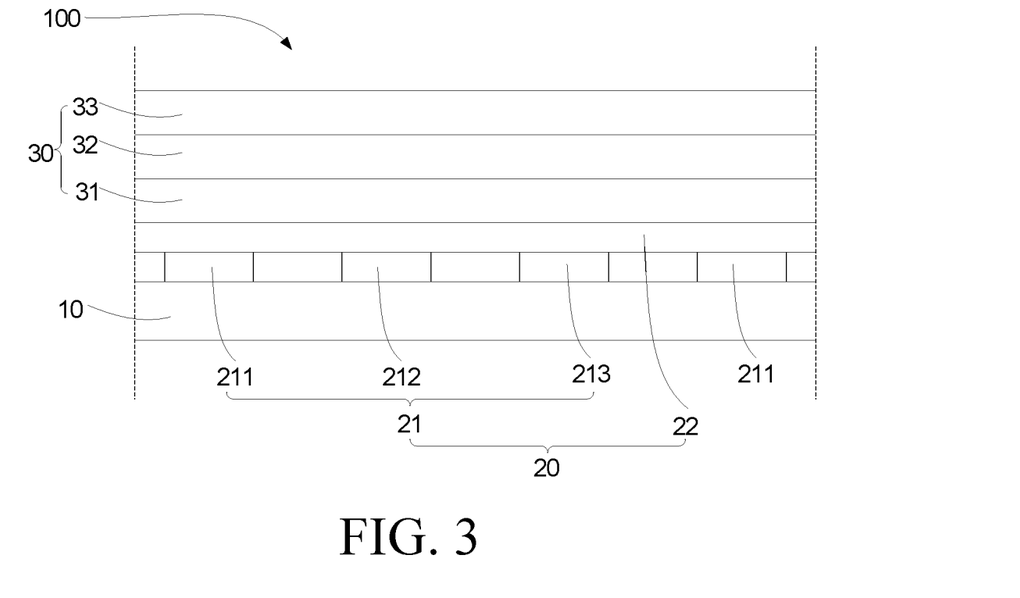
FIG. 3 is a schematic cross-sectional structure diagram of a display panel provided by an embodiment of the application.
Figure 4:
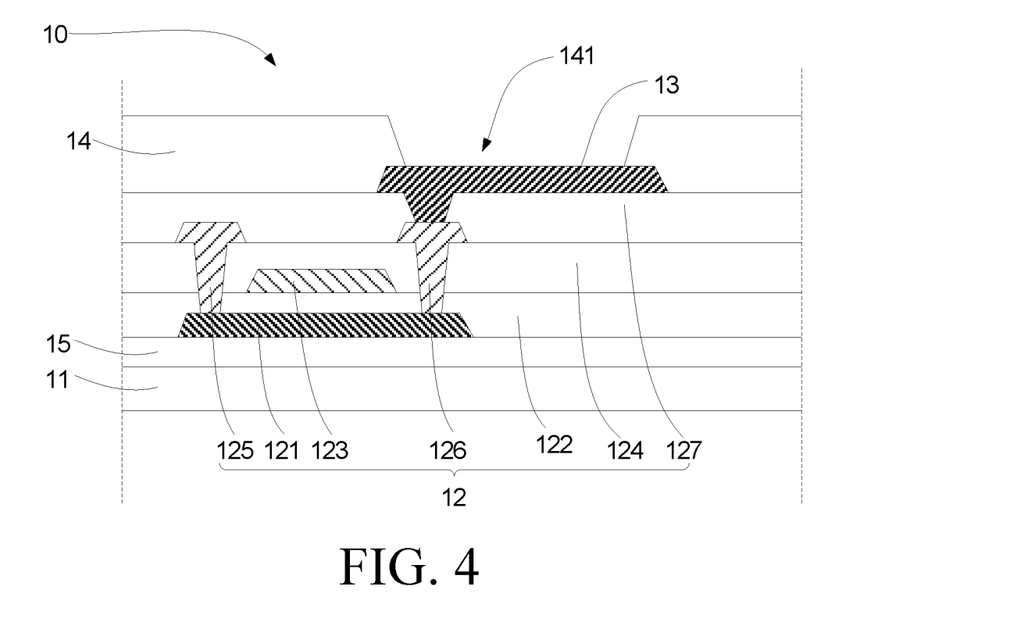
FIG. 4 is a schematic cross-sectional diagram of a structure of a driver substrate provided by an embodiment of the present application.
Figure 5:
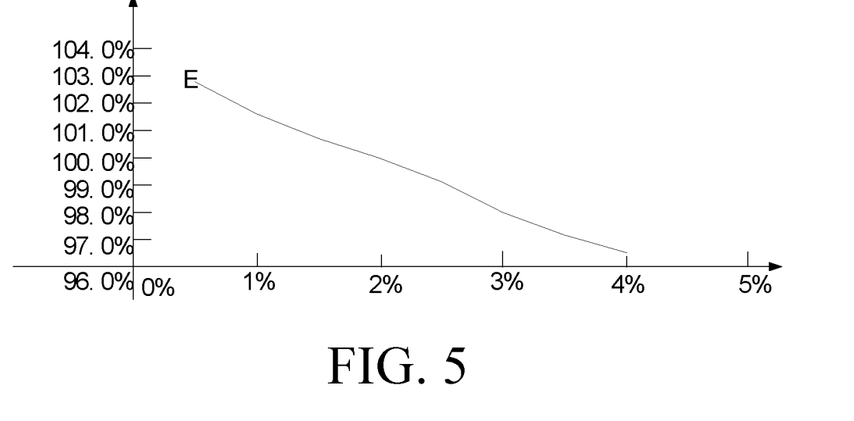
FIG. 5 is a diagram showing a variation trend of a luminous efficiency of a red light-emitting layer according to a doping concentration according in an embodiment of the preset application.
Figure 6:
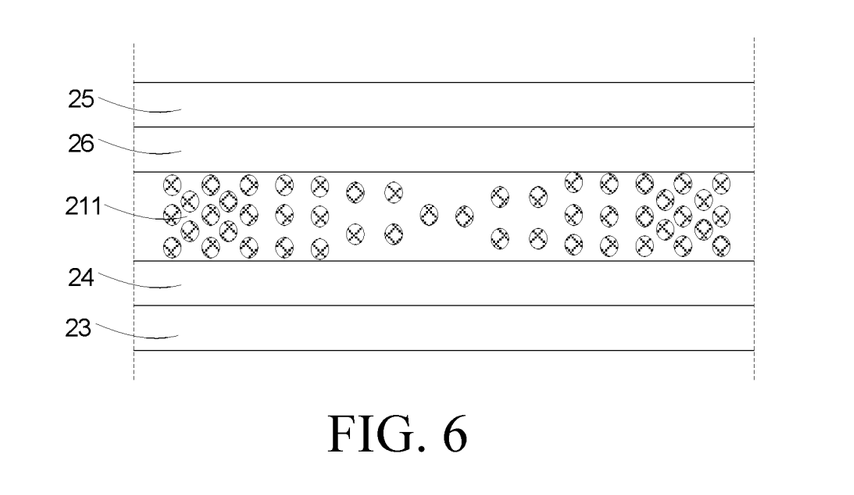
FIG. 6 is a schematic cross-sectional diagram of a structure of a red light-emitting layer provided by an embodiment of the present application.
Figure 7:
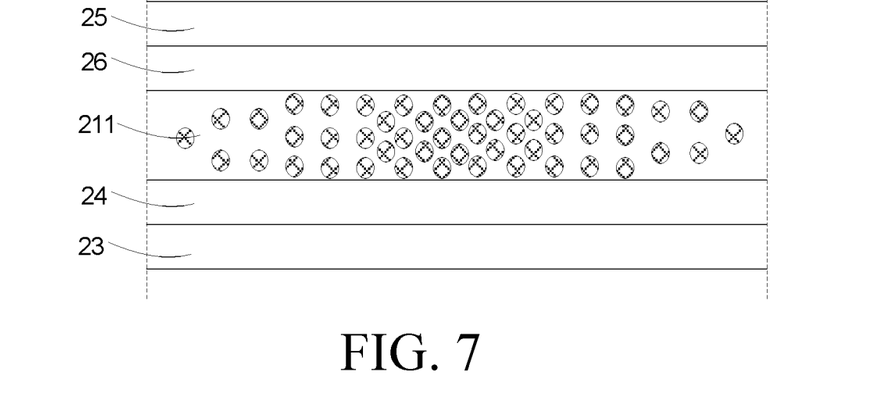
FIG. 7 is a schematic cross-sectional diagram of a structure of a red light-emitting layer provided by another embodiment of the present application.

Please refer to FIGS. 3 to 7. FIG. 3 is a schematic cross-sectional structure diagram of a display panel provided by an embodiment of the present application. FIG. 4 is a schematic cross-sectional structure diagram of a driver substrate provided by an embodiment of this application. FIG. 5 is a diagram showing a variation trend of a luminous efficiency of a red light-emitting layer according to a doping concentration according in an embodiment of the preset application. FIG. 6 and FIG. 7 are schematic cross-sectional diagrams of a structure of a red light-emitting layer provided by embodiments of the present application. The display panel 100 comprises a driver substrate 10, a light-emitting function layer 20 and an encapsulation layer 30. The light-emitting function layer 20 is disposed on the driver substrate 10, the encapsulation layer 30 is disposed on the light-emitting function layer 20, and the light-emitting function layer 20 comprises a light-emitting layer 21 on the driving substrate 10 and a cathode 22 on the light-emitting layer 21. The driver substrate 10 and the cathode 22 together drive the light-emitting layer 21 to emit light, and the encapsulation layer 30 is located on the cathode 22 for protecting the light-emitting layer 21 from water and oxygen intrusion which causing failure of the light-emitting layer 21.

As shown in FIG. 4, the driver substrate 10 comprises a substrate 11, a thin film transistor 12, a pixel electrode 13, and a pixel definition layer 14, etc. The thin film transistor 12 is located on the substrate 11, the pixel electrode 13 is located on the thin film transistor 12, electrically connecting to the thin film transistor 12, and the pixel defining layer 14 is disposed on the pixel electrode 13.

Optionally, the substrate 11 may be a rigid substrate or a flexible substrate. When the substrate 11 is a rigid substrate, it may comprise a rigid substrate such as a glass substrate. When the substrate 11 is a flexible substrate, it may comprise a polyimide (PI) thin film, an ultra-thin glass film and other flexible substrates.

Optionally, a buffer layer 15 is further provided between the substrate 11 and the thin film transistor 12, and the buffer layer 15 can prevent undesirable impurities or pollutants (such as moisture, oxygen, etc.) from being diffused into the device that may be damaged by these impurities or contaminants from the substrate 11, while also providing a planar top surface.

Optionally, the thin film transistor 12 may comprises an active layer 121, a gate insulating layer 122, a gate 123, an interlayer insulating layer 124, a source electrode 125, a drain electrode 126, and a planarization layer 127 which are sequentially stacked on the buffer layer 15. Of course, the structure of the thin film transistor 12 in the present embodiment of the present application is only for illustration, and the present application is not limited thereto.

The active layer 121 is disposed on the buffer layer 15, and the active layer 121 comprises a channel region and a source doped region and a drain doped region located on both sides of the channel region. The gate insulating layer 122 covers the active layer 121 and the buffer layer 15, the gate 123 is disposed on the gate insulating layer 122. The gate 123 is correspondingly arranged with respect to the channel region of the active layer 121. The interlayer insulating layer 124 covers the gate 123 and the gate insulating layer 122, the source electrode 125 and the drain electrode 126 are disposed on the interlayer insulating layer 124, and the source electrode 125 and the drain electrode 126 are respectively connected to the source doped region and the drain doped region.

The planarization layer 127 covers the source electrode 125, the drain electrode 126, and the interlayer insulating layer 124. The pixel electrode 13 is disposed on the planarization layer 127, and the pixel electrode 13 is connected to the source electrode 125 or the drain electrode 126 of the thin film transistor 12. The pixel definition layer 14 covers the pixel electrode 13 and the planarization layer 127, and the pixel definition layer 14 is provided with a pixel opening 141, and the pixel opening 141 exposes a portion of the pixel electrode 13 to define an area for setting the light-emitting layer 21.

The light-emitting layer 21 comprises a red light-emitting layer 211, a green light-emitting layer 212, and a blue light-emitting layer 213. The red light-emitting layer 211, the green light-emitting layer 212 and the blue light-emitting layer 213 are respectively arranged in various pixel opening 141. The red light emitting layer 211, the green light emitting layer 212, and the blue light emitting layer 213 respectively emit red light, green light, and blue light under the joint action of the pixel electrode 13 and the cathode 22 to realize the color display of the display panel 100.

The cathode 22 can be a transparent electrode or a reflective electrode, depending on the light emitting direction of the display panel 100. For example, when the display panel 100 adopts top emission, the cathode 22 adopts a transparent electrode to improve the light transmittance. When the display panel 100 adopts bottom emission, the cathode 22 adopts a reflective electrode to improve the utilization rate of light.

Of course, the light-emitting functional layer 20 may also comprise a hole injection layer (HIL) 23 and a hole transporting layer (HTL) 24 provided between the light-emitting layer 21 and the pixel electrode 13. An electron injection layer (EIL) 25 and an electron transport layer (ETL) 26 are provided between the light-emitting layer 21 and the cathode 22.

The encapsulation layer 30 is disposed on the cathode 22 of the light-emitting function layer 20, and the encapsulation layer 30 uses thin film encapsulation. The thin film encapsulation may be a stacked structure formed by successively stacking three layers of a first inorganic encapsulation layer 31, an organic encapsulation layer 32, and a second inorganic encapsulation layer or a stacked structure of more layers, which is used to protect the light-emitting layer 21 of the light-emitting function layer 20 and prevent water and oxygen intrusion from causing failure of the light-emitting layer 21. When the encapsulation layer 30 is fabricated, a film thickness of the encapsulation layer 30 at the center point of the display panel 100 and the area outside the center point is likely to be different due to the influence of factors such as process variations, and a film thickness of the encapsulation layer 30 is in a range of difference that is generally between −10% and 10%.

The inventors of the present application have discovered in research that the difference in the film thickness of the encapsulation layer 30 will cause a color shifting phenomenon in the display panel 100, especially the difference in the film thickness of the first inorganic encapsulation layer 31 affects the color shifting with the greatest impact. Moreover, the change trend of the chromaticity difference Δu of the display panel 100 with the first inorganic encapsulation layer 31 is consistent with the change trend of the luminous efficiency of the red light-emitting layer 211 with the first inorganic encapsulation layer 31.

For this reason, a doping concentration of the red light-emitting layer 211 at a center point of the display panel 100 of the embodiment of the present application is different from a doping concentration of the red light-emitting layer 211 in an area other than the center point of the display panel 100. A luminous efficiency of the red light-emitting layer 211 at the center point of the display panel 100 is consistent with a light-emitting efficiency of the red light-emitting layer 211 in the area outside the center point of the display panel 100.

It should be noted that the light-emitting layer 21 is usually formed by doping light-emitting materials of different colors as guest materials in a main material. For example, the main material may be Alq3, CBP, BAlq, and the like. A luminous efficiency of the light-emitting layer 21 can be changed by changing the doping concentration of the guest material. For example, when a doping concentration of the red light-emitting layer 211 ranges from 0.5% to 4%, the luminous efficiency of the red light-emitting layer 211 can be improved by reducing the doping concentration of the red light-emitting layer 211, and the luminous efficiency of the red light-emitting layer 211 can be reduced by increasing the doping concentration of the red light-emitting layer 211, as shown in FIG. 5. In FIG. 5, the abscissa represents a doping concentration of the red light-emitting layer 211, the ordinate represents a luminous efficiency of the red light-emitting layer 211, and a curve E represents a change trend of a luminous efficiency of the red light-emitting layer 211 with the doping concentration. The doping concentration of the red light-emitting layer 211 refers to a doping concentration of the red light-emitting material in the red light-emitting layer 211.

Therefore, as shown in FIG. 6, when the doping concentration of the red light-emitting layer 211 is gradually increased from the center point of the display panel 100 to the area outside the center point, the light-emitting efficiency of the red light-emitting layer 211 is increased from the center point and begins to gradually decrease toward the area outside the center point, so that when the red light emitting layer 211 is accompanied by the variations of the film thickness of the first inorganic encapsulation layer 31, the luminous efficiency of the red light emitting layer 211 at the center point is consistent the luminous efficiency of the red light emitting layer 211 in the area outside the center point, thereby reducing the chromaticity difference between the center point and the area outside the center point, and avoiding the phenomenon of appearing blue around the display panel 100. The doping concentration of the red light-emitting layer 211 ranges from 0.5% to 4%.

As shown in FIG. 7, when the doping concentration of the red light-emitting layer 211 is gradually reduced from the center point of the display panel 100 to the area outside the center point, the luminous efficiency of the red light-emitting layer 211 is gradually increased from the center point to the area outside the center point, so that when the red light-emitting layer 211 is accompanied by the variation in the film thickness of the first inorganic encapsulation layer 31, the luminous efficiency of the red light-emitting layer 211 at the center point is consistent with the luminous efficiency of the red light-emitting layer 211 in the area outside the center point, so that the chromaticity difference between the center point and the area outside the center point is reduced, and avoids to appear red around the display panel 100. The doping concentration of the red light-emitting layer 211 ranges from 0.5% to 4%.

In the present application, by adjusting the doping concentration of the red light-emitting layer 211, the color shifting problem of the existing OLED screen due to the difference in the film thickness of the encapsulation layer 30 can be improved. After adjusting the doping concentration of the red light-emitting layer 211, the changing trend of the chromaticity difference Δu of the display panel 100 with the film thickness difference of the first inorganic encapsulation layer 31 is shown as a curve A' shown in FIG. 8. The luminous efficiency of the light-emitting layer 21 varying with the film thickness of the first inorganic encapsulation layer 319 is shows as curves B', C', and D'. The curve B' represents the changing trend of the luminous efficiency of the red light-emitting layer 211 with the difference in the film thickness of the first inorganic encapsulation layer 31, the curve C' represents the changing trend of the luminous efficiency of the green light-emitting layer 212 with the difference in the film thickness of the first inorganic encapsulation layer 31, and the curve D' represents the luminous efficiency of the blue light-emitting layer 213 with the difference in the film thickness of the first inorganic encapsulation layer 31.

Figure 8:
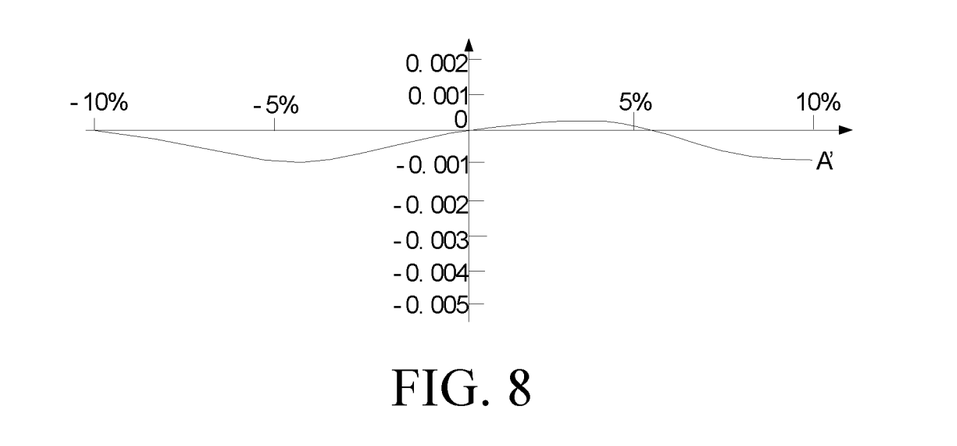
FIG. 8 is a diagram showing a variation trend of a chromaticity difference of a display panel provided by an embodiment of the present application with the difference in a film thickness of a first inorganic encapsulation layer.
Figure 9:
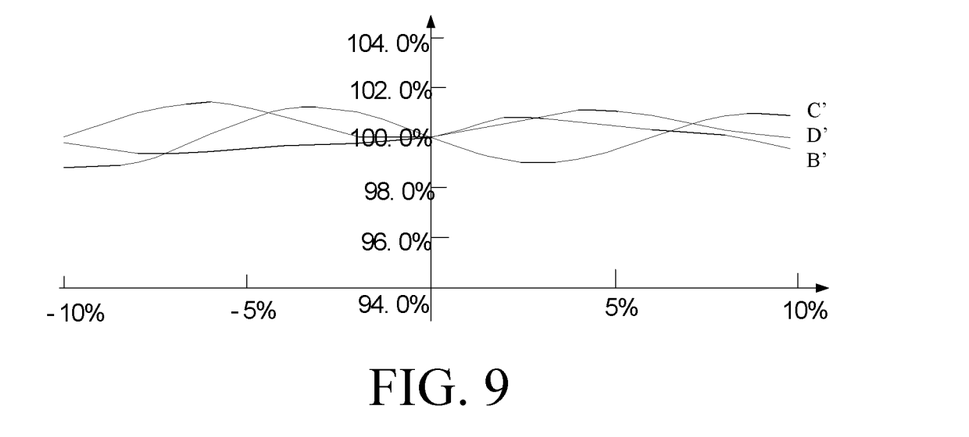
FIG. 9 is a diagram showing a variation trend of a luminous efficiency of a light-emitting layer of a display panel provided by an embodiment of the present application according to differences in a film thickness of a first inorganic encapsulation layer.

Referring to FIG. 8 and FIG. 1, it can be clearly seen that after adjusting the doping concentration of the red light-emitting layer 211 in the present application, a variation range of the chromaticity difference Δu of the display panel 100 is reduced from −0.004–0.001 to −0.001–0.001, which significantly improves the color shifting problem caused by the difference in film thickness of the encapsulation layer 30. Referring to FIG. 9 and FIG. 2 in combination, it can be clearly seen that after adjusting the doping concentration of the red light-emitting layer 211 in the present application, the changing trend of the luminous efficiency of the red light-emitting layer 211 obviously slows down with the difference in the film thickness of the first inorganic encapsulation layer 31, that is, with the change of the film thickness difference of the first inorganic encapsulation layer 31, the luminous efficiency of the red light-emitting layer 211 is basically unchanged.

Figure 10:
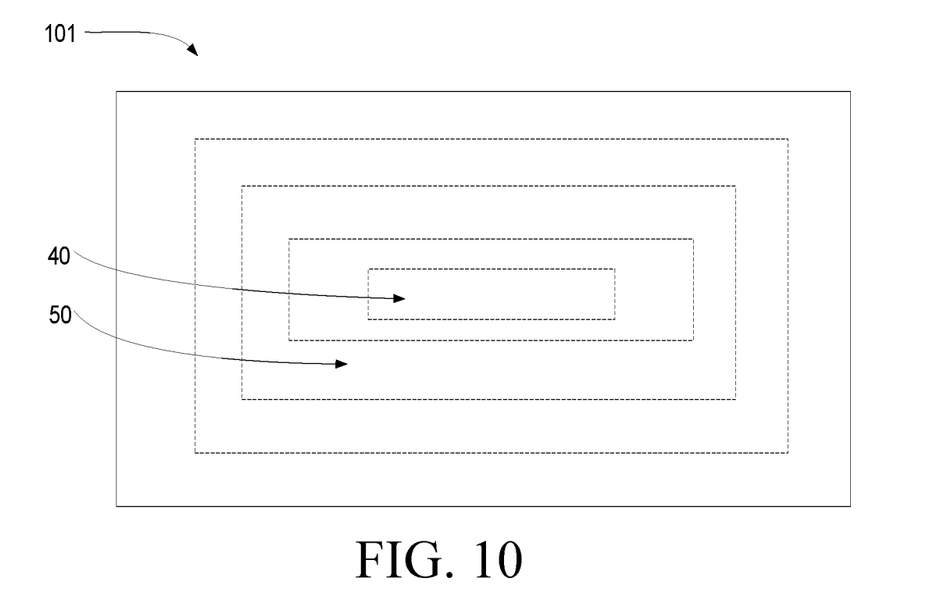
FIG. 10 is a schematic top view of a structure of a display panel provided by an embodiment of the present application.

In one embodiment, please refer to FIG. 10, which is a schematic top view of a structure of a display panel provided by the embodiment of the present application. The difference from the above-mentioned embodiment is that the display panel 101 is divided into a plurality of regions 50 from the center point 40 to the area outside the center point 40, and the red light-emitting layer of each of the regions 50 has a different doping concentration. The doping concentration of the red light-emitting layers in the same region 50 is the same, so when fabricating red light-emitting layers with different doping concentrations, the process can be simplified to save cost. For other descriptions, please refer to the above-mentioned embodiment, which will not be repeated here.

Figure 11:
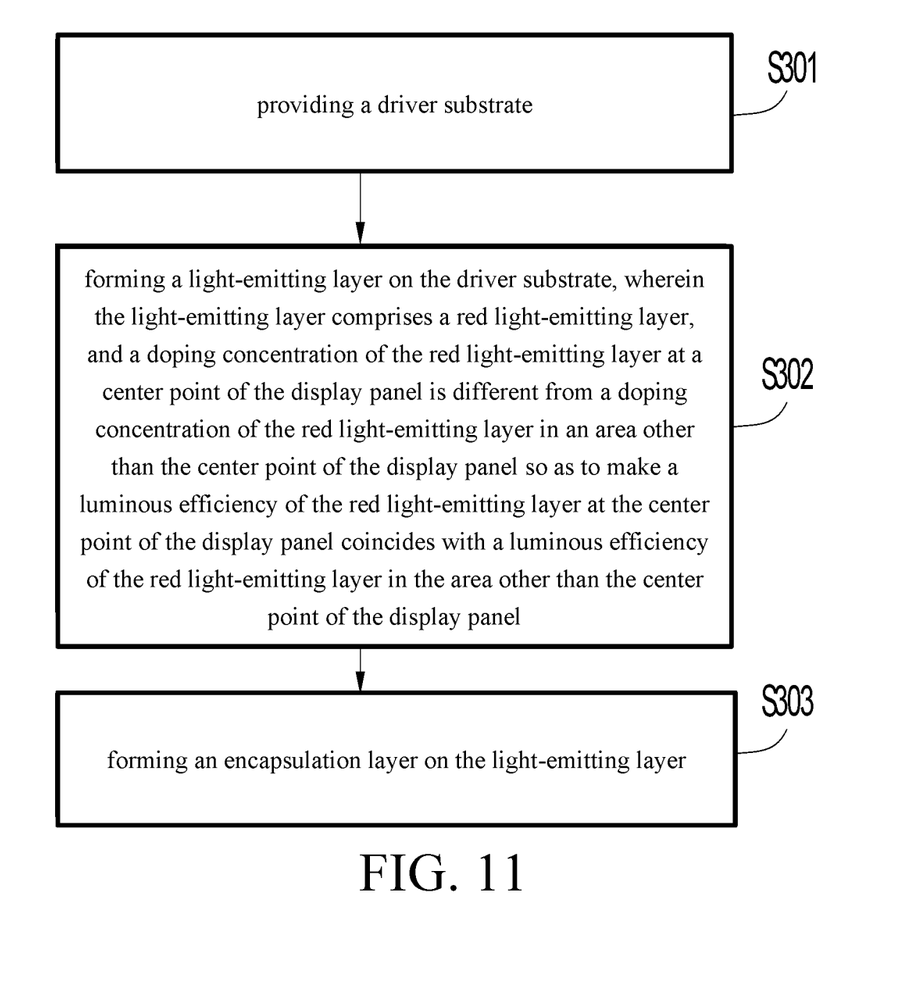
FIG. 11 is a schematic flowchart of a fabrication method of a display panel provided by an embodiment of the present application.

In one embodiment, a fabrication method of a display panel is provided. The fabrication method of a display panel is used to prepare the display panel of one of the above-mentioned embodiments. A schematic flow chart of the fabrication method of the display panel comprises the following steps:

S301: providing a driver substrate

Specifically, referring to FIG. 4, the driver substrate 10 comprising a substrate 11, a thin film transistor 12, a pixel electrode 13, a pixel definition layer 14, and the like. The thin film transistor 12 is disposed on the substrate 11, and the pixel electrode 13 is disposed on the thin film transistor 12, electrically connecting to the thin film transistor 12, and the pixel defining layer 14 is disposed on the pixel electrode 13. The pixel defining layer 14 is provided with a pixel opening 141, and the pixel opening 141 exposes a portion of the pixel electrode 13.

S302: forming a light-emitting layer 21 on the driver substrate 10

The light-emitting layer 21 comprises a red light-emitting layer 211, a doping concentration of the red light-emitting layer 211 at the center point of the driver substrate 10 and a doping concentration of the area outside the center point is different, so that the luminous efficiency of the red light-emitting layer 211 at the center of the driver substrate 10 is consistent with the luminous efficiency of the red light-emitting layer 211 in the area outside the center of the driver substrate 10;

Specifically, referring to FIG. 3 and FIG. 4 in combination, a light-emitting function layer 20 is formed on the driver substrate 10, and the light-emitting function layer 20 comprises a light-emitting layer 21 on the driver substrate 10 and a cathode layer 22 on the light-emitting layer 21. The cathode 22 of the driver substrate 10 and the cathode 22 together drive the light-emitting layer 21 to emit light. The light-emitting layer 21 comprises a red light-emitting layer 211, a green light-emitting layer 212, and a blue light-emitting layer 213. The red light-emitting layer 211, the green light-emitting layer 212 and the blue light-emitting layer 213 are respectively arranged in the different pixel openings 141. The red light-emitting layer 211, the green light-emitting layer 212, and the blue light-emitting layer 213 respectively emit red light, green light, and blue light under the joint action of the pixel electrode 13 and the cathode 22 for realizing the color display of the display panel 100.

The driver substrate 10 is divided into a plurality of sections from the center point to the area outside the center point, and the red light-emitting layer 211 of each section has a different doping concentration, and the red light-emitting layer in the same section is different. The doping concentration of 211 is the same. When the doping concentration of the red light-emitting layer 211 in each section gradually increases from the center point of the driver substrate 10 to the area outside the center point, the luminous efficiency of the red light-emitting layer 211 in each section begins to gradually decreases from the center point toward the area outside the center point, so that when the red light-emitting layer 211 is accompanied by variation in the film thickness of the first inorganic encapsulation layer 31, the luminous efficiency of the red light-emitting layer 211 at the center point is consistent the luminous efficiency of the red light-emitting layer 211 in the area outside the center point for reducing the chromaticity difference between the center point and the area outside the center point, and avoid the blue phenomenon around the display panel. The doping concentration of the red light-emitting layer 211 ranges from 0.5% to 4%.

When the doping concentration of the red light-emitting layer 211 of each section is gradually reduced from the center point of the driver substrate 10 to the area outside the center point, the luminous efficiency of the red light-emitting layer 211 of each section starts to gradually increase from the center point to the area beyond the central point, so that when the red light-emitting layer 211 is accompanied by variation in the film thickness of the first inorganic encapsulation layer 31, the central point and the red light-emitting layer 211 outside the central point have the same luminous efficiency, thereby reducing the chromaticity difference between the center point and the area outside the center point and avoiding appearing red around the display panel. The doping concentration of the red light-emitting layer 211 ranges from 0.5% to 4%.

Therefore, the light-emitting efficiency of the red light-emitting layer 211 can be improved by reducing the doping concentration of the red light-emitting layer 211, and the light-emitting efficiency of the red light-emitting layer 211 can be reduced by increasing the doping concentration of the red light-emitting layer 211. The luminous efficiency of the red light-emitting layer 211 at the central point is consistent the luminous efficiency of the red light-emitting layer 211 in the area outside the central point, and the color shifting problem of the existing OLED screen can be eliminated by changing the doping concentration of the red light-emitting layer 211 outside the central point to gradually increase or decrease the luminous efficiency of the red light-emitting layer 211 from the central point to the area outside the central point.

It should be noted that when forming the light-emitting layer 21, an evaporation mask can be generally used to evaporate light-emitting materials to form the light-emitting layer 21, but the present application is not limited to this. When an evaporation mask is used to prepare the red light-emitting layer 211 with different doping concentrations, this can be achieved by changing the limiting angle of the evaporation mask.

S303: forming an encapsulation layer 30 on the light-emitting layer 21

Specifically, referring to FIG. 3, the encapsulation layer 30 is disposed on the cathode 22 of the light-emitting function layer 20, the encapsulation layer 30 is encapsulated by a thin film, and the thin film encapsulation may be composed of a laminated structures of three layers comprising a first inorganic encapsulation layer 31, an organic encapsulation layer 32 and the second inorganic encapsulation layer 33 or a more-layered laminated structures which are used to protect the light-emitting layer 21 of the light-emitting function layer 20 from failure caused of water and oxygen entering the light-emitting layer 21.

An embodiment of the present application also provides a display device, which comprises the display panel of one of the foregoing embodiments, a circuit board and other devices bound to the display panel, a cover plate covering the display panel, and the like.

According to the above embodiment, it can be seen that:

The present application provides a display panel, a fabrication method thereof, and a display device. The display panel comprises a light-emitting layer disposed on a driving substrate, The light-emitting layer comprises a red light-emitting layer, and the doping concentration of the red light-emitting layer gradually increases or decreases from the center point of the display panel toward the area outside the center point, so that the luminous efficiency of the red light-emitting layer at the center point of the display panel is consistent with the luminous efficiency of the red light-emitting layer outside the center point of the display panel, which solves the color shifting problem around the display panel caused by the difference in a film thickness of the encapsulation layer, thereby improving a chromaticity uniformity of the display panel.

In the above-mentioned embodiments, the description of each embodiment has its own emphasis. For parts that are not described in detail in an embodiment, reference may be made to related descriptions of other embodiments.

The above is a detailed introduction to a mobile terminal provided by an embodiment of the present application. Specific examples are used in this article to illustrate the principles and implementation of the present application. Its core idea, at the same time, for those skilled in the art, according to the idea of this application, there will be changes in the specific implementation and scope of application. In summary, the content of the present specification should not be construed as a limitation to this application.

What is claimed is:

1. A display panel, comprising:
   a drive substrate;
   a light-emitting function layer disposed on the drive substrate, wherein the light-emitting function layer comprises a light-emitting layer, the light-emitting layer comprises a red light-emitting layer; and
   an encapsulation layer disposed on the light-emitting function layer, wherein the encapsulation layer comprises a first inorganic encapsulation film, an organic encapsulation film, and a second inorganic encapsulation film,
   wherein the first inorganic encapsulation film has different thicknesses respectively at a center point of the display panel and in an area other than the center point of the display panel;
   the red light-emitting layer has different doping concentrations respectively at the center point of the display panel and in the area other than the center point of the display panel so that a luminous efficiency of the red light-emitting layer at the center point of the display panel coincides with a luminous efficiency of the red light-emitting layer in the area other than the center point of the display panel.

2. The display panel of claim 1, wherein the doping concentration of the red light-emitting layer ranges from 0.5% to 4%.

3. The display panel of claim 2, wherein the doping concentration of the red light-emitting layer gradually increases from the center point of the display panel to the area other than the center point.

4. The display panel of claim 2, wherein the doping concentration of the red light-emitting layer gradually decreases from the center point of the display panel to the area other than the center point.

5. The display panel according to claim 1, wherein the display panel is divided into a plurality of sections from the center point to the area other than the center point, and the red light-emitting layer has different doping concentrations respectively in the plurality of sections.

6. The display panel of claim 5, wherein the red light-emitting layer has a uniform doping concentration in each of the plurality of sections.

7. A fabrication method of a display panel, comprising:
   providing a drive substrate;
   forming a light-emitting function layer on the drive substrate, wherein the light-emitting function layer comprises a light-emitting layer, the light-emitting layer comprises a red light-emitting layer; and
   forming an encapsulation layer on a side of the light-emitting layer away from the drive substrate, wherein the encapsulation layer comprises a first inorganic encapsulation film, an organic encapsulation film, and a second inorganic encapsulation film,
   wherein the first inorganic encapsulation film has different thicknesses respectively at a center point of the display panel and in an area other than the center point of the display panel;
   the red light-emitting layer has different doping concentrations respectively at the center point of the display panel and in the area other than the center point of the display panel so that a luminous efficiency of the red light-emitting layer at the center point of the display panel coincides with a luminous efficiency of the red light-emitting layer in the area other than the center point of the display panel.

8. The fabrication method of the display panel according to claim 7, wherein the doping concentration of the red light-emitting layer ranges from 0.5% to 4%.

9. The fabrication method of the display panel according to claim 8, wherein the doping concentration of the red light-emitting layer gradually increases from the center point of the display panel to the area other than the center point.

10. The fabrication method of the display panel according to claim 8, wherein the doping concentration of the red light-emitting layer gradually decreases from the center point of the display panel to the area other than the center point.

11. The fabrication method of the display panel according to claim 8, wherein the display panel is divided into a plurality of sections from the center point to the area other than the center point, and the red light-emitting layer has different doping concentrations respectively in the plurality of sections.

12. The fabrication method of the display panel according to claim 11, the red light-emitting layer has a uniform doping concentration in each of the plurality of sections.

13. A display device, comprising a display panel, wherein the display panel comprising:
   a drive substrate;
   a light-emitting layer disposed on the drive substrate, wherein the light-emitting function layer comprises a light-emitting layer, the light-emitting layer comprises a red light-emitting layer; and
   an encapsulation layer disposed on the light-emitting function layer, wherein the encapsulation layer comprises a first inorganic encapsulation film, an organic encapsulation film, and a second inorganic encapsulation film,
wherein the first inorganic encapsulation film has different thicknesses respectively at a center point of the display panel and in an area other than the center point of the display panel;
the red light-emitting layer has different doping concentrations respectively at the center point of the display panel and in the area other than the center point of the display panel so that a luminous efficiency of the red light-emitting layer at the center point of the display panel coincides with a luminous efficiency of the red light-emitting layer in the area other than the center point of the display panel.

14. The display device of claim 13, wherein the doping concentration of the red light-emitting layer ranges from 0.5% to 4%.

15. The display device of claim 14, wherein the doping concentration of the red light-emitting layer gradually increases from the center point of the display panel to the area other than the center point.

16. The display device of claim 14, wherein the doping concentration of the red light-emitting layer gradually decreases from the center point of the display panel to the area other than the center point.

17. The display device of claim 14, wherein the display panel is divided into a plurality of sections from the center point to the area other than the center point, and the red light-emitting layer has different doping concentrations respectively in the plurality of sections.

18. The display device of claim 17, wherein the red light-emitting layer has a uniform doping concentration in each of the plurality of sections.

* * * * *